(12) United States Patent
Yin et al.

(10) Patent No.: US 8,518,780 B1
(45) Date of Patent: Aug. 27, 2013

(54) FABRICATION METHODS OF INTEGRATED SEMICONDUCTOR STRUCTURE

(75) Inventors: Jin-Mu Yin, Kaohsiung (TW);
Shyh-Wei Wang, Hsinchu (TW);
Yen-Ming Chen, Chu-Pei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/446,852

(22) Filed: Apr. 13, 2012

(51) Int. Cl.
*H01L 21/8232* (2006.01)

(52) U.S. Cl.
USPC ..... 438/275; 438/283; 438/595; 257/E21.409

(58) Field of Classification Search
USPC ............. 438/197, 275, 279, 283, 585, 595; 257/E21.409
See application file for complete search history.

(56) References Cited

U.S. PATENT DOCUMENTS

| | | | |
|---|---|---|---|
| 6,255,698 B1 * | 7/2001 | Gardner et al. | 257/369 |
| 6,875,680 B1 * | 4/2005 | Park | 438/595 |
| 7,824,988 B2 * | 11/2010 | Hoefler et al. | 438/276 |
| 2003/0219953 A1 * | 11/2003 | Mayuzumi | 438/353 |
| 2004/0132253 A1 * | 7/2004 | Hori | 438/275 |
| 2011/0210389 A1 * | 9/2011 | Griebenow et al. | 257/330 |

* cited by examiner

*Primary Examiner* — Tuan N. Quach

(74) *Attorney, Agent, or Firm* — Lowe Hauptman & Ham, LLP

(57) ABSTRACT

A method for manufacturing the integrated circuit device comprises providing a substrate having a first region, a second region, and a third region. A first dielectric layer is formed in the first region of the substrate. A second dielectric layer is formed in the second region and the third region. A sacrificial layer is formed over the first dielectric layer and the second dielectric layer. The sacrificial layer, the first dielectric layer, and the second dielectric layer are patterned to form a first gate stack, a second gate stack, and a third gate stack. An interlayer dielectric (ILD) layer is formed in between the first gate stack, the second gate stack, and the third gate stack. The second gate stack is removed to form an opening adjacent to the ILD layer and a third dielectric layer is formed in the opening.

20 Claims, 11 Drawing Sheets

FABRICATION METHODS OF INTEGRATED SEMICONDUCTOR STRUCTURE

TECHNICAL FIELD

The present disclosure relates generally to the field of semiconductor devices, and more particularly, to metal gate transistors, integrated circuits, systems, and fabrication methods thereof.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

During the scaling trend, various materials have been implemented for a gate electrode and gate dielectric for CMOS devices. CMOS devices have typically been formed with a gate oxide and polysilicon gate electrode. There has been a desire to replace the gate oxide and polysilicon gate electrode with a high-k gate dielectric and metal gate electrode to improve device performance as feature sizes continue to decrease.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
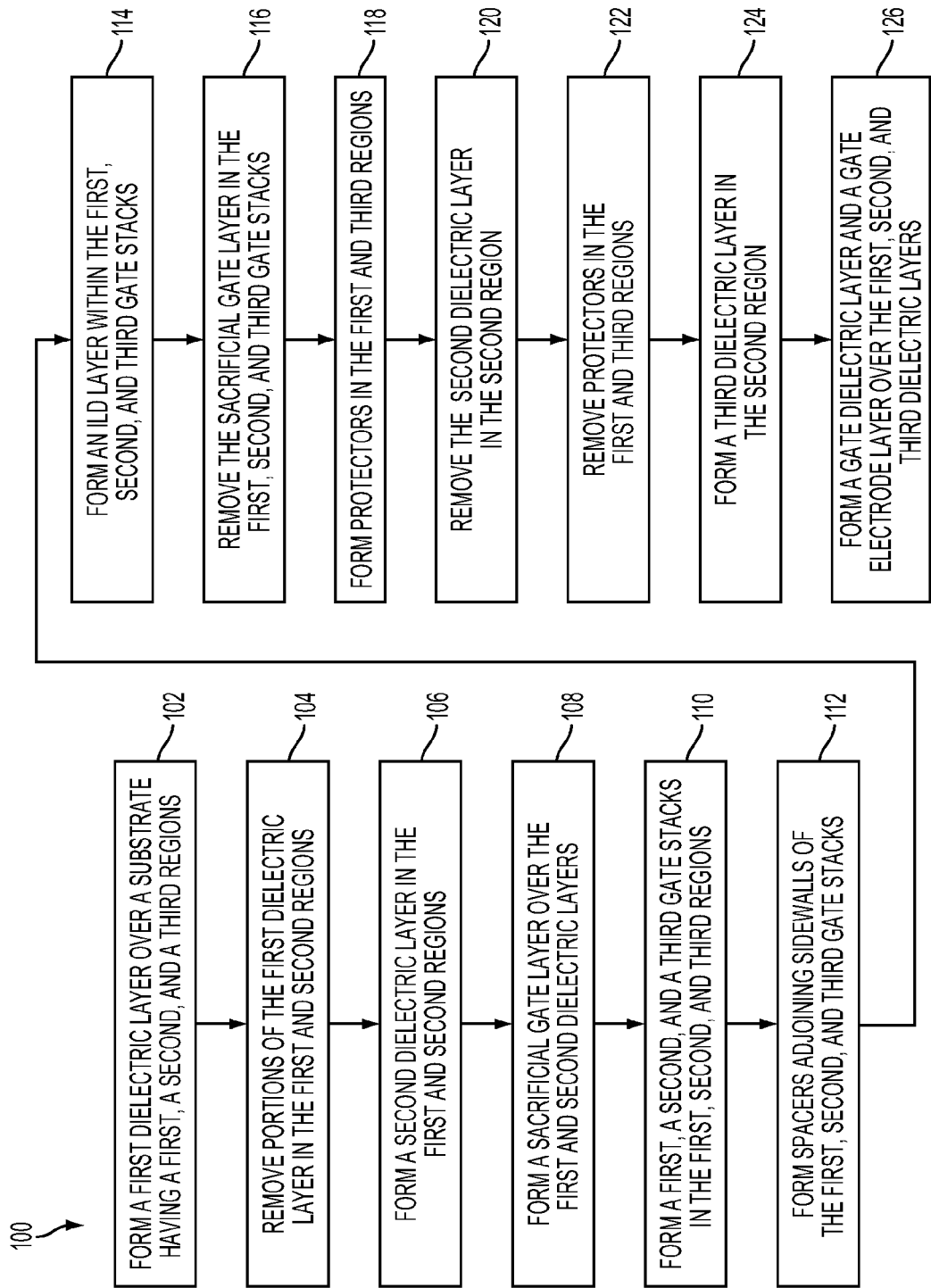
FIG. 1 is a flow chart of a method for fabricating an integrated circuit device according to an embodiment of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference to FIGS. 1 and 2-11, a method 100 and a semiconductor device 200 are collectively described below. The semiconductor device 200 illustrates an integrated circuit, or portion thereof, that can comprise memory cells and/or logic circuits. The semiconductor device 200 can include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors, other suitable components, and/or combinations thereof. It is understood that additional steps can be provided before, during, and/or after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200.

Figure 2:
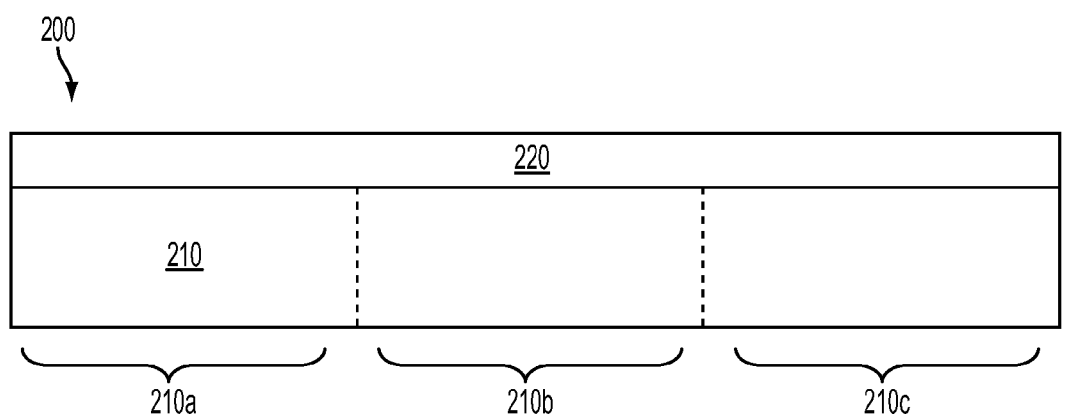
FIGS. 2-11 are various diagrams of cross-sectional views of an embodiment of an integrated circuit device during various fabrication stages according to the method of FIG. 1.

Referring to FIGS. 1 and 2, the method 100 begins at step 102, wherein a first dielectric layer 220 is formed over a substrate 210. In the present embodiment, the substrate 210 comprises a first region 210a, a second region 210b, and a third region 210c. In the present embodiment, the first region 210a is preserved for forming a first core device therein, such as low power device. In the present embodiment, the second region 210b is preserved for forming a second core device therein, such as standard device with an operation voltage higher than low power device. In the present embodiment, the third region 210c is preserved for forming an input/output (I/O) circuit therein. The first region 210a, the second region 210b, and the third region 210c may each include a N-type transistor (NMOS) device and a P-type transistor (PMOS) device over the substrate 210.

In the present embodiment, the substrate 210 is a semiconductor substrate comprising silicon. Alternatively, the substrate 210 comprises an elementary semiconductor including silicon and/or germanium in crystal; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some embodiments, the semiconductor substrate may include a doped epi layer. In other embodiments, the silicon substrate may include a multilayer compound semiconductor structure.

The substrate 210 may include various doped regions depending on design requirements (e.g., p-type wells or n-type wells). The doped regions may be doped with p-type dopants, such as boron or $BF_2$; n-type dopants, such as phosphorus or arsenic; or a combination thereof. The doped regions may be formed directly in the substrate 210, in a P-well structure, in an N-well structure, in a dual-well structure, or using a raised structure. The semiconductor device 200 may include a PFET device and/or a NFET device, and thus, the substrate 210 may include various doped regions configured for the PFET device and/or the NFET device.

In some embodiments, the first dielectric layer 220 comprises a material of silicon oxide, silicon oxynitride, silicon nitride, or combinations thereof. In other embodiments, the first dielectric layer 220 is silicon oxide. In at least one embodiment, the first dielectric layer 220 has a first thickness ranging between about 5 Angstroms and about 50 Angstroms. In other embodiments, the first thickness ranging between about 25 Angstroms and about 35 Angstroms. In at least one embodiment, the first dielectric layer 220 is formed using a thermal process, such as furnace process, rapid thermal annealing (RTA) process, and/or in-situ steam generation (ISSG) process. In other embodiment, the first dielectric layer 220 is formed using a chemical vapor deposition (CVD) process, such as low-pressure chemical vapor deposition (LPCVD) process.

Figure 3:
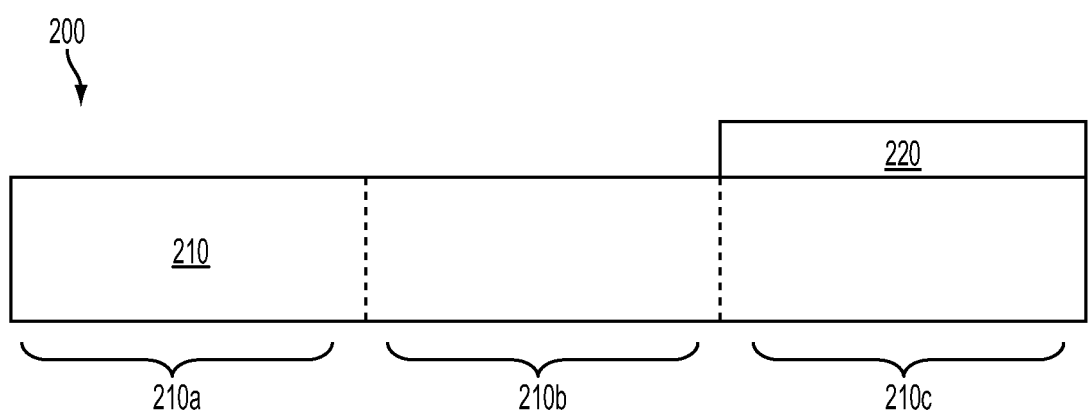

Referring to FIGS. 1 and 3, the method 100 continues with step 104 in which a patterning process is applied to remove the portions of first dielectric layer 220 in the first region 210a and the second region 210b. In the present embodiment, the patterning process exposes the top surface of the substrate 210 in the first region 210a and the second region 210b. In the present embodiment, the patterning process does not remove the portion of first dielectric layer 220 in the third region 210c to form the remaining first dielectric layer 220 in the third region 210c. The patterning process, for example, includes forming a layer of photoresist (not shown) over the first dielectric layer 220 by a suitable process, such as spin-on coating, and then exposing and developing the layer of photoresist to form a photoresist feature. Then, a pattern of the photoresist feature can be transferred to the underlying first dielectric layer 220 by a dry and/or wet etching process. Additionally, an anti-reflective coating (ARC) layer (not shown) may be formed under the layer of photoresist to enhance a subsequent patterning process as known in the art. The photoresist feature may be stripped thereafter. It is understood that the above embodiments do not limit the processing steps that may be utilized to pattern the first dielectric layer 220.

Figure 4:
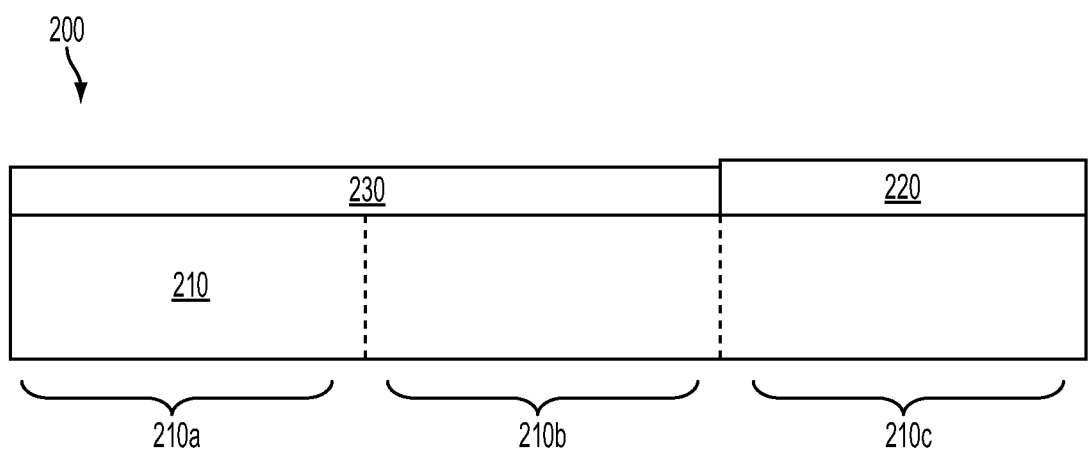

Referring to FIGS. 1 and 4, the method 100 continues with step 106 in which a second dielectric layer 230 is formed in the first region 210a and the second region 210b over the substrate 210. In some embodiments, the second dielectric layer 230 comprises a material of silicon oxide, silicon oxynitride, silicon nitride, or combinations thereof. In other embodiments, the second dielectric layer 230 is silicon oxide. In some embodiments, the second dielectric layer 230 comprises a material same as the first dielectric layer 220 and has a second thickness less than the first thickness of the first dielectric layer 220. In an alternative embodiment, the second dielectric layer 230 comprises a material different from the first dielectric layer 220 and has a second thickness similar to or greater than the first thickness of the first dielectric layer 220. In some embodiments, the second thickness ranging between about 5 Angstroms and about 50 Angstroms. In other embodiments, the second thickness ranging between about 5 Angstroms and about 25 Angstroms.

In at least one embodiment, the second dielectric layer 230 is formed using a thermal process, such as furnace process, rapid thermal annealing (RTA) process, and/or in-situ steam generation (ISSG) process. As mentioned above, the patterning process removes the portions of first dielectric layer 220 in the first region 210a and the second region 210b to expose the top surface of the substrate 210 in the first region 210a and the second region 210b. As mentioned above, the patterning process does not remove the portion of first dielectric layer 220 in the third region 210c such that the remaining first dielectric layer 220 covers the top surface of the substrate 210 in the third region 210c. Therefore, in some embodiments, the second dielectric layer 230 is selectively formed in the first region 210a and the second region 210b. In some embodiments, the second dielectric layer 230 is not formed in the third region 210c. In an alternative embodiment, the process for forming the second dielectric layer 230 increases the first thickness of the first dielectric layer 220 not exceeding about 10 Angstroms.

Figure 5:
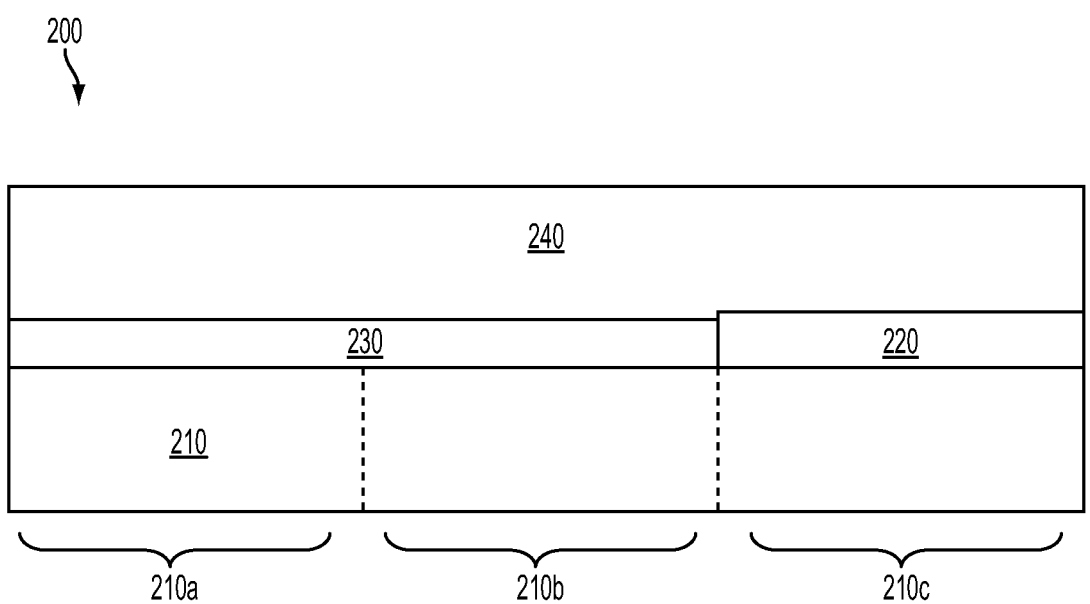

Referring to FIGS. 1 and 5, the method 100 continues with step 108 in which a sacrificial gate layer 240 is formed over the remaining first dielectric layer 220 and the second dielectric layer 230. In some embodiments, the sacrificial gate layer 240 is a polycrystalline silicon (polysilicon) layer. The polysilicon layer may be doped for proper conductivity. Alternatively, the polysilicon is not necessarily doped if a sacrificial gate is to be formed and replaced in a subsequent gate replacement process. Alternatively, the sacrificial gate layer 240 is amorphous silicon or other material that has a desired etch rate with respect to the underlying first dielectric layer 220 and the second dielectric layer 230, and spacers formed subsequently. The sacrificial gate layer 240 can be formed by deposition, including CVD, ALD, other suitable methods, and/or combinations thereof.

Figure 6:
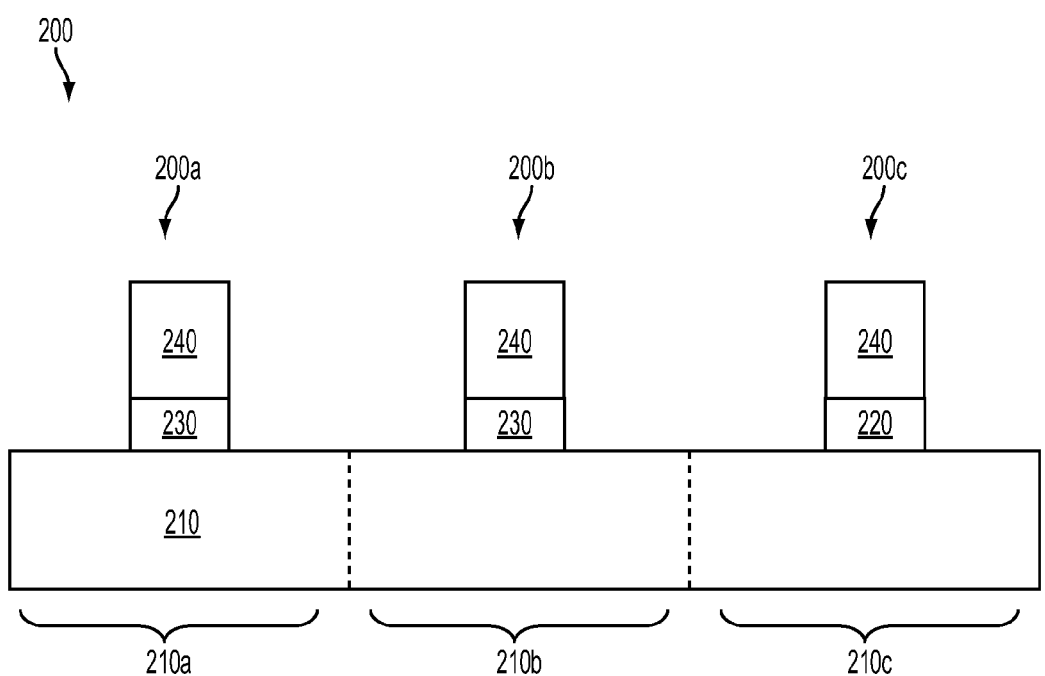

Referring to FIGS. 1 and 6, the method 100 continues with step 110 in which a patterning process is applied to the sacrificial gate layer 240 and the underlying first dielectric layer 220 and the second dielectric layer 230 to form a first gate stack 200a, a second gate stack 200b, and a third gate stack 200c in the first region 210a, the second region 210b, and the third region 210c, respectively. The patterning process, for example, includes forming a layer of photoresist (not shown) over the sacrificial gate layer 240 by a suitable process, such as spin-on coating, and then exposing and developing the layer of photoresist to form a photoresist feature. Then, a pattern of the photoresist feature can be transferred to the underlying sacrificial gate layer 240 and the first dielectric layer 220 and the second dielectric layer 230 to form the first gate stack 200a, the second gate stack 200b, and the third gate stack 200c by a dry etching process. Additionally, an anti-reflective coating (ARC) layer (not shown) may be formed under the layer of photoresist to enhance a subsequent patterning process as known in the art. The photoresist feature may be stripped thereafter. It is understood that the above embodiments do not limit the processing steps that may be utilized to form the first gate stack 200a, the second gate stack 200b, and the third gate stack 200c.

Figure 7:
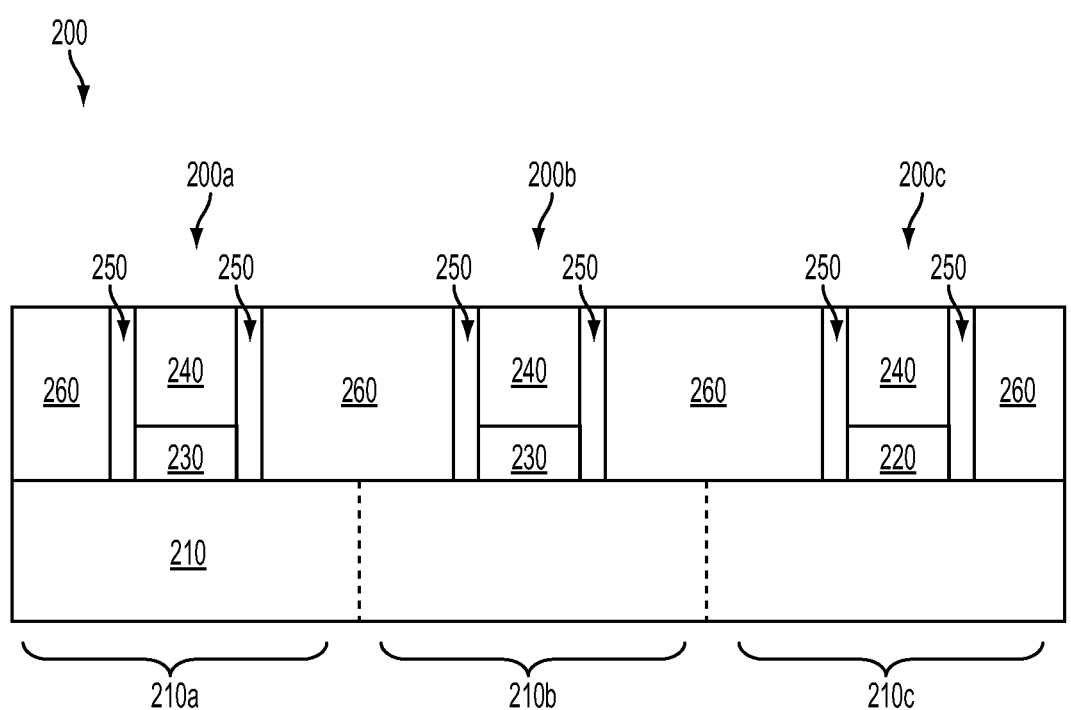

Referring to FIGS. 1 and 7, the method 100 continues with step 112 in which spacers 250 are formed adjoining sidewalls of each of the first gate stack 200a, the second gate stack 200b, and the third gate stack 200c. In some embodiments, spacers 250 are formed by blanket depositing a dielectric spacer layer (not shown), such as a silicon nitride layer, overlying the substrate 210, the first gate stack 200a, the second gate stack 200b, and the third gate stack 200c. Continuously, the dielectric spacer layer is anisotropically etched back to form the spacers 250. Alternatively, liners (not shown) may be included under the spacers 250 by forming a dielectric liner layer, e.g., a silicon oxide layer, under the spacer layer, and then the spacer layer and the liner layer are etched in sequence to form the spacers 250 and the underlying liners. In still another embodiment, the spacers 250 may include other dielectric materials, such as silicon oxide, silicon oxynitride, or combinations thereof.

Still referring to FIGS. 1 and 7, the method 100 continues with step 114 in which an interlayer dielectric (ILD) layer 260 is filled in the space in between and over the first gate stack 200a, the second gate stack 200b, and the third gate stack 200c. In some embodiments, a chemical mechanical polishing (CMP) process is further applied to planarize the ILD layer 260. In some embodiments, the ILD layer 260 is a dielectric layer comprising materials such as oxide, nitride, oxynitride, low-k dielectric material, ultra low-k dielectric material, extreme low-k dielectric material, other dielectric material, and/or combinations thereof. The ILD layer 260 may be formed by, for example, a CVD process, a HDP CVD process, a HARP, a spin-coating process, other deposition process, and/or any combinations thereof. In some embodiments, an additional dielectric layer (not shown) can be formed below or over the ILD layer 260.

Figure 8:
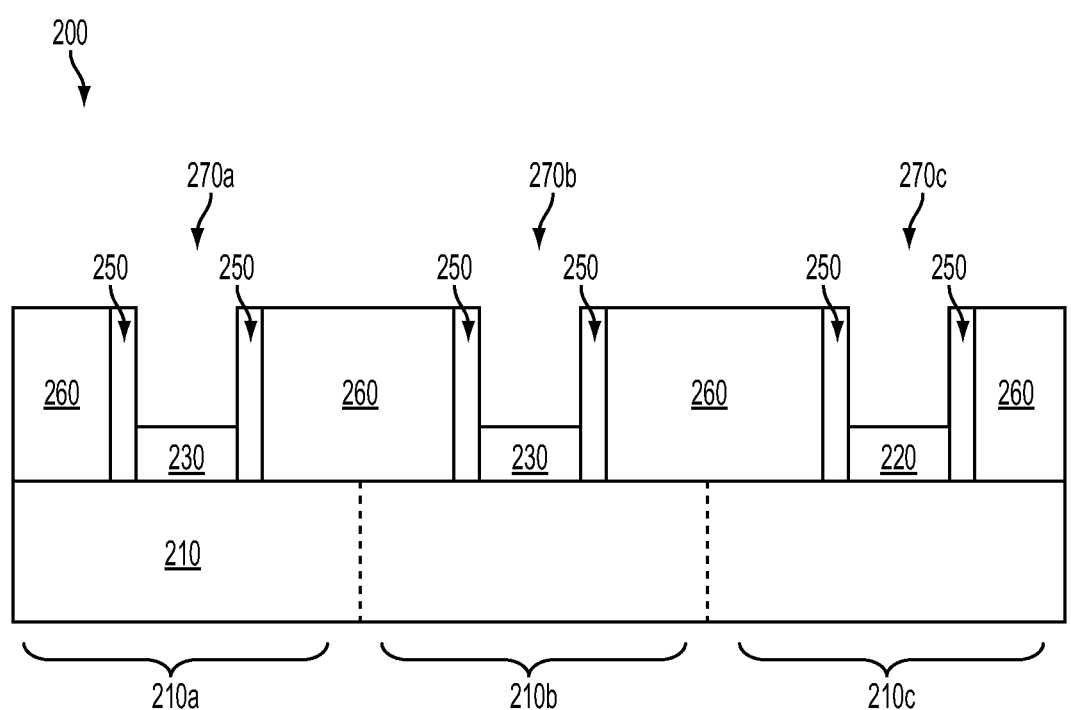

Referring to FIGS. 1 and 8, the method 100 continues with step 116 in which the sacrificial gate layer 240 is removed from the first gate stack 200a, the second gate stack 200b, and the third gate stack 200c. The removing step forms openings 270a, 270b, and 270c in between the spacers 250, thereby exposing the first and second dielectric layers 220 and 230 formed over the first region 210a, the second region 210b, and the third region 210c of the substrate 210, respectively. In some embodiments, the removing process comprises a dry and/or wet etching process. In at least one embodiment, the removing process is a dry etching process. The dry etching process, for example, is performed by using an etching gas, comprising $NF_3$, $CF_4$, $CH_2F_2$, $Cl_2$, HBr, $SF_6$, or combinations thereof, with a gas flow rate ranging between about 5 standard cubic centimeter per minute (sccm) and about 300 sccm. The dry etching process may be performed in a transformer coupled plasma (TCP) etcher, with a power ranging between about 300 watts (W) and about 1000 W, with a bias ranging between about 0 V and about 300 V, and at a temperature ranging between about 23° C. and about 70° C. In other embodiments, the removing process is a wet etching process. The wet etching process, for example, is performed by using a chemical, comprising tetramethylammonium hydroxide (TMAH), $NH_4OH$, or a mixture thereof. TMAH and $NH_4OH$ may have a concentration of about 15%-20% and 5%-50%, respectively. The wet etching process may be performed at a temperature ranging between about 23° C. and about 70° C. The removing process has a high etching selectivity to the underlying first dielectric layer 220 and the second dielectric layer 230, therefore, the underlying first dielectric layer 220 and the second dielectric layer 230 are not substantially removed during removing the sacrificial gate layer 240. The first dielectric layer 220 and the second dielectric layer 230 in the openings 270a, 270b, and 270c are then exposed after removing the sacrificial gate layer 240.

Figure 9:
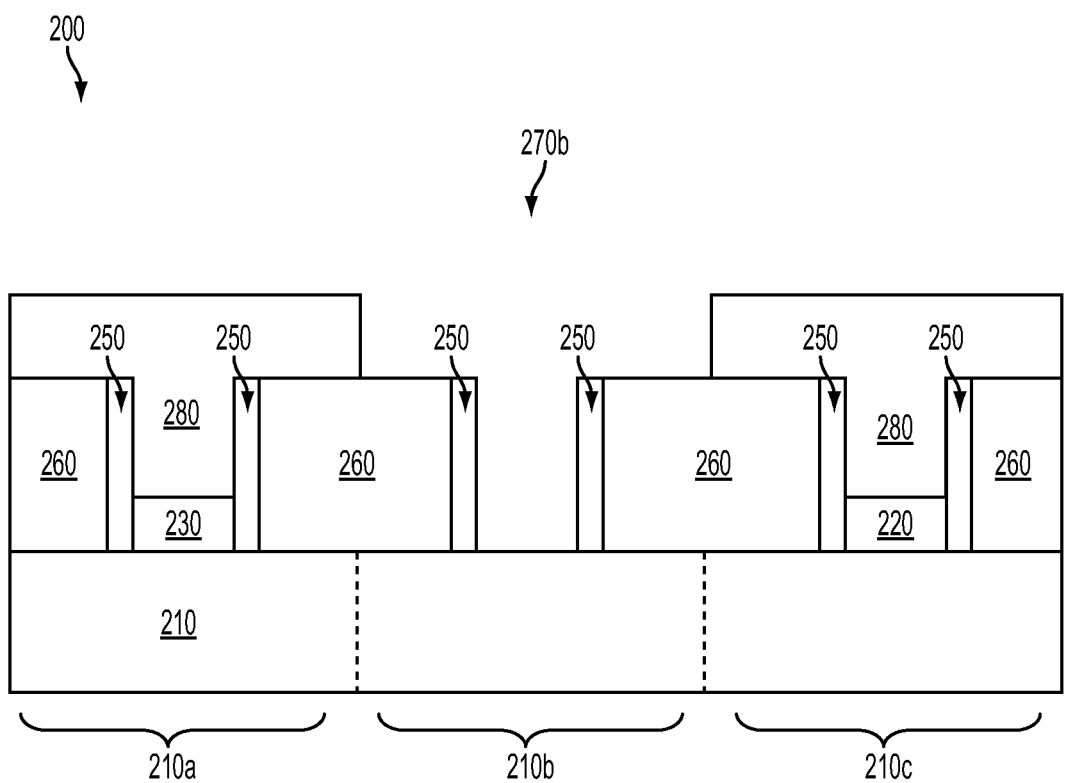

Referring to FIGS. 1 and 9, the method 100 continues with step 118 in which protectors 280 are formed over the first dielectric layer 220 and the second dielectric layer 230 in the openings 270c and 270a, respectively. In some embodiments, the second dielectric layer 230 in the opening 270b of the second region 210b is exposed without being covered by the protectors 280. The protectors 280 may protect the first dielectric layer 220 and the second dielectric layer 230 in the openings 270c and 270a, respectively from being removed during a subsequent removing step. The protectors 280, e.g., photoresist or hard mask layer, may be formed by a suitable process, such as forming a layer of photoresist (not shown), and then exposing and developing the layer of photoresist to form a photoresist feature.

Still referring to FIGS. 1 and 9, the method 100 continues with step 120 in which a removing process is provided to remove the second dielectric layer 230 in the opening 270b of the second region 210b. The removing process, for example, is a dry etching and/or wet etching process. In at least one embodiment, the second dielectric layer 230 is removed using a chemical, comprising HF solution, dilute HF solution (DHF), buffered oxide etch (BOE) solution, or vapor HF. In some embodiments, the ratio of HF to de-ionized water in the dilute HF solution is about 1:50. A high etching selectivity is achieved between the second dielectric layer 230 and the underlying second region 210b of substrate 210 therefore the second region 210b in the opening 270b is not substantially removed during the etching process. As mentioned above, the portion of second dielectric layer 230 in the first region 210a and the first dielectric layer 220 in the third region 210c are covered by the protectors 280. Therefore, the portion of second dielectric layer 230 in the first region 210a and the first dielectric layer 220 in the third region 210c are not attacked by the etching process. Hence, the likely damage to the portion of the second dielectric layer 230 in the first region 210a and the first dielectric layer 220 in the third region 210c caused by the etching process can be prevented.

Figure 10:
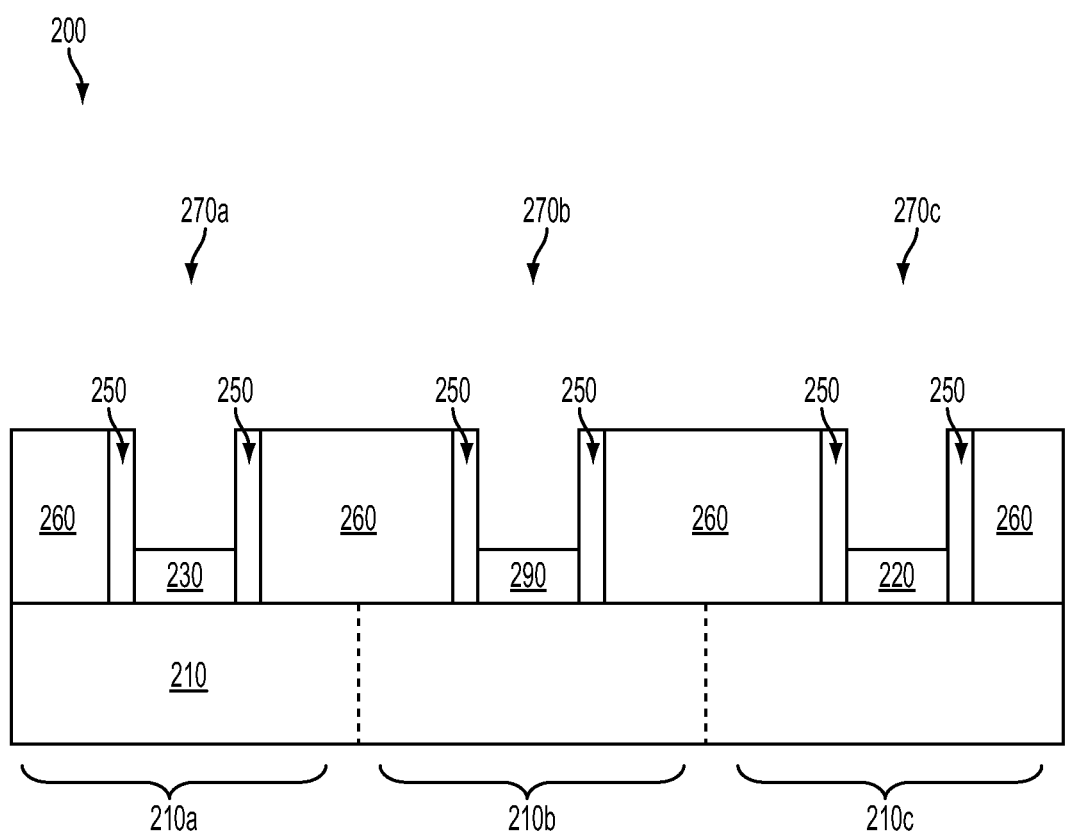

Referring to FIGS. 1 and 10, the method 100 continues with step 122 in which the protectors 280 are removed. The removing process, for example, is a dry etching and/or wet etching process. In some embodiments, the removing process is a stripping process or an ashing process using oxygen or oxygen-containing gas. Thereafter, a cleaning process may be provided. In the present embodiment, the cleaning process utilize a cleaning solution comprising SPM ($H_2SO_4$ and $H_2O_2$) performed at a temperature ranging between about 80° C. and about 250° C.

Still referring to FIGS. 1 and 10, the method 100 continues with step 124 in which a third dielectric layer 290 is formed in the opening 270b over the second region 210b of the substrate 210. In some embodiments, the third dielectric layer 290 comprises a material of silicon oxide, silicon oxynitride, silicon nitride, or combinations thereof. In other embodiments, the third dielectric layer 290 is silicon oxide. In some embodiments, the third dielectric layer 290 comprises a material same as the second dielectric layer 230 and has a third thickness less than the second thickness of the second dielectric layer 230. In an alternative embodiment, the third dielectric layer 290 comprises a material different from the second dielectric layer 230 and has the third thickness similar to or greater than the second thickness of the second dielectric layer 230. In some embodiments, the third thickness ranging between about 5 Angstroms and about 50 Angstroms. In other embodiments, the third thickness ranging between about 5 Angstroms and about 25 Angstroms.

In at least one embodiment, the third dielectric layer 290 is formed using a thermal process, such as furnace process, rapid thermal annealing (RTA) process, and/or in-situ steam generation (ISSG) process. In some embodiments, the third dielectric layer 290 is selectively formed in the second region 210b. In some embodiments, the third dielectric layer 290 is not formed in the first region 210a or the third region 210c because the second dielectric layer 230 and the first dielectric layer 220 covers the top surface of the substrate 210 in the first region 210a and the third region 210c, respectively. In an alternative embodiment, the process for forming the third dielectric layer 290 increases the first thickness of the first dielectric layer 220 or the second thickness of the second dielectric layer 230 not exceeding about 10 Angstroms.

Figure 11:
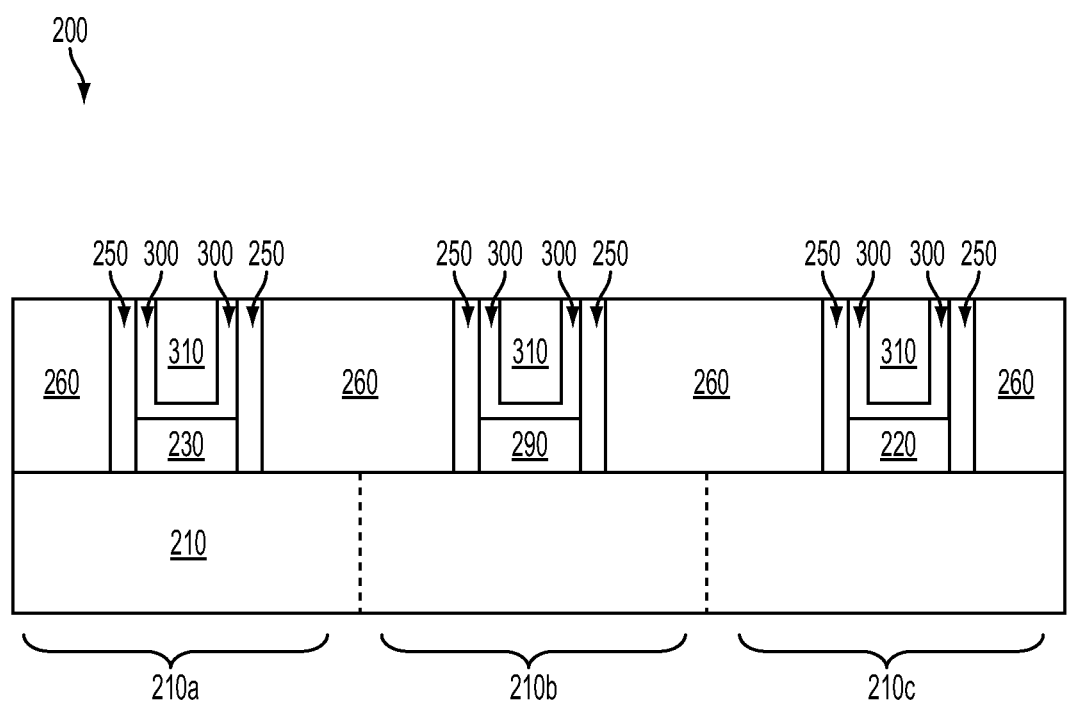

Referring to FIGS. 1 and 11, the method 100 continues with step 126 in which a gate dielectric layer 300 is formed over the first dielectric layer 220, the second dielectric layer 230, and the third dielectric layer 290, and a gate electrode layer 310 are then formed over the gate dielectric layer 300. In some embodiments, the gate dielectric layer 300 is conformally formed in the openings 270a, 270b, and 270c. In some embodiments, the gate electrode layer 310 is formed to fill the openings 270a, 270b, and 270c.

In some embodiments, the gate dielectric layer 300 is a high-k dielectric layer disposed over an interfacial layer (not shown). In some embodiments, the gate dielectric layer 300 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, and/or combinations thereof. The gate dielectric layer 300 may further be selected from metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, other suitable materials, and/or combinations thereof. The gate dielectric layer 300 may be formed by any suitable process, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, plating, other suitable processes, and/or combinations thereof.

In some embodiments, the gate electrode layer 310 comprises a metal layer. In some embodiments, the gate electrode layer 310 includes a work function metallic layer configured to provide a proper work function value. In one embodiment, the work function metallic layer is an n-type work function metallic layer, such as hafnium, zirconium, titanium, tantalum, aluminum, metal carbides, other suitable materials, or the combinations thereof, for forming a NMOS device. In one alternative embodiment, the work function metallic layer is a p-type work function metallic layer, such as ruthenium, palladium, platinum, cobalt, nickel, conductive metal oxides, e.g., ruthenium oxide, other suitable materials, or the combinations thereof, for forming a PMOS device. In one alternative embodiment, the work function metallic layer comprises an n-type work function metallic layer and a p-type work function metallic layer to result a combined work function for forming a NMOS device or a PMOS device.

In some embodiments, conductor structures (not shown) are formed over the gate electrode layer 310 in the openings 270a, 270b, and 270c. The conductor structures can be configured to provide an electrical transmission. The conductor structures can include structures, such as lines, bulks, plug, and/or other shape of structures. The conductor structures can include metal (e.g., Al) or silicide such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), titanium silicide (TiSi), other suitable materials, and/or the combinations thereof.

Thereafter, the semiconductor device 200 continues with processing to complete fabrication as discussed briefly below. For example, a multilayer interconnection (MLI) including metal layers and inter-metal dielectric (IMD) is formed over the substrate to electrically connect various features or structures of the semiconductor device. The multilayer interconnection includes vertical interconnects, such as conventional vias or contacts, and horizontal interconnects, such as metal lines. The various interconnection features may implement various conductive materials including copper, tungsten and silicide. In at least one embodiment, a damascene process is used to form a copper multilayer interconnection structure.

In summary, the disclosed methods and integrated circuit devices result in improved device performance, including but not limited to, improved control over surface roughness of the dielectric layers in the core device regions by preventing the dielectric layers in the core device regions being damaged during removal of the sacrificial gate layer. Further, a thickness of the dielectric layers in the core device regions can be precisely controlled, which may simplify the process flow. It is understood that different embodiments may have different advantages, and that no particular advantage is necessarily required of any embodiment.

In one embodiment, a method comprises providing a substrate having a first region, a second region, and a third region; forming a first dielectric layer having a first thickness in the first region of the substrate; forming a second dielectric layer having a second thickness in the second region and the third region of the substrate; forming a sacrificial layer over the first dielectric layer and the second dielectric layer; patterning the sacrificial layer, the first dielectric layer, and the second dielectric layer to form a first gate stack, a second gate stack, and a third gate stack in the first region, the second region, and the third region, respectively; forming an interlayer dielectric (ILD) layer in between the first gate stack, the second gate stack, and the third gate stack; removing the second gate stack to form an opening adjacent to the ILD layer; and forming a third dielectric layer having a third thickness in the opening.

In another embodiment, a method comprises providing a substrate having a first region, a second region, and a third region; forming a first dielectric layer having a first thickness over the substrate; removing the portion of first dielectric layer in the second region and the third region; forming a second dielectric layer having a second thickness over the substrate in the second region and the third region; forming a sacrificial layer over the first dielectric layer and the second dielectric layer; patterning the sacrificial layer, the first dielectric layer, and the second dielectric layer to form a first gate stack, a second gate stack, and a third gate stack in the first region, the second region, and the third region, respectively; forming an interlayer dielectric (ILD) layer in between the first gate stack, the second gate stack, and the third gate stack; removing the sacrificial layer; removing the second dielectric layer in the second region to form an opening adjacent to the ILD layer; forming a third dielectric layer having a third thickness in the opening; and forming a high-k dielectric layer over the first dielectric layer, the second dielectric layer, and the third dielectric layer.

In still another embodiment, a method comprises providing a substrate having a device region, a low power device region, and an I/O circuit region; forming a first oxide layer over the substrate; removing the first oxide layer in the device region and the low power device region; forming a second oxide layer in the device region and the low power device region; forming a polysilicon layer over the first oxide layer and the second oxide layer; patterning the polysilicon layer, the first oxide layer, and the second oxide layer to form a first gate stack in the device region, a second gate stack in the low power device region, and a third gate stack in the I/O circuit region; forming an ILD layer in between the first gate stack, the second gate stack, and the third gate stack; removing the patterned polysilicon layer; forming protectors over the first oxide layer in the I/O circuit region and the second oxide layer in the low power device region; removing the second oxide layer in the device region; thereafter removing the protectors; forming a third oxide layer in the device region; forming a high-k gate dielectric layer over the first oxide layer, the second oxide layer, and the third oxide layer; and forming a metal gate layer over the high-k gate dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   providing a substrate having a first region, a second region, and a third region;
   forming a first dielectric layer having a first thickness in the first region of the substrate;
   forming a second dielectric layer after said forming a first dielectric layer, said second dielectric layer having a second thickness in the second region and the third region of the substrate, said second dielectric layer not in the first region of the substrate;
   forming a sacrificial layer over the first dielectric layer and the second dielectric layer;
   patterning the sacrificial layer, the first dielectric layer, and the second dielectric layer to form a first gate stack, a second gate stack, and a third gate stack in the first region, the second region, and the third region, respectively;
   forming an interlayer dielectric (ILD) layer in between the first gate stack, the second gate stack, and the third gate stack;
   removing the second gate stack to form an opening adjacent to the ILD layer while retaining the first gate stack and the third gate stack; and
   forming a third dielectric layer having a third thickness in the opening.

2. The method of claim 1, wherein the first region is an input/output (I/O) circuit region, the second region and the third region are core device regions.

3. The method of claim 1, further comprising:
   forming a high-k dielectric layer over the first dielectric layer, the second dielectric layer, and the third dielectric layer; and
   forming a metal gate layer over the high-k dielectric layer.

4. The method of claim 1, wherein the first dielectric layer, the second dielectric layer, and the third dielectric layer comprise a same material.

5. The method of claim 1, wherein the first dielectric layer, the second dielectric layer, and the third dielectric layer are silicon oxide.

6. The method of claim 1, wherein the first thickness, the second thickness, and the third thickness are different.

7. The method of claim 1, wherein the first thickness is greater than the second thickness.

8. The method of claim 1, wherein the second thickness is greater than the third thickness.

9. The method of claim 1, wherein the first thickness ranges between about 25 Angstroms and about 35 Angstroms, the second thickness and the third thickness range between about 5 Angstroms and about 25 Angstroms.

10. The method of claim 1, wherein the second dielectric layer and the third dielectric layer are formed using a thermal process.

11. A method comprising:
    providing a substrate having a first region, a second region, and a third region;
    forming a first dielectric layer having a first thickness over the substrate;
    removing the portion of first dielectric layer in the second region and the third region;
    forming a second dielectric layer having a second thickness over the substrate in the second region and the third region;
    forming a sacrificial layer over the first dielectric layer and the second dielectric layer;
    patterning the sacrificial layer, the first dielectric layer, and the second dielectric layer to form a first gate stack, a second gate stack, and a third gate stack in the first region, the second region, and the third region, respectively;
    forming an interlayer dielectric (ILD) layer in between the first gate stack, the second gate stack, and the third gate stack;
    removing the sacrificial layer;
    removing the second dielectric layer in the second region to form an opening adjacent to the ILD layer;
    forming a third dielectric layer having a third thickness in the opening; and
    forming a high-k dielectric layer over the first dielectric layer, the second dielectric layer, and the third dielectric layer.

12. The method of claim 11, further comprising:
    forming protectors over the first dielectric layer in the first region and the second dielectric layer in the third region before the step of removing the second dielectric layer in the second region.

13. The method of claim 12, further comprising:
    removing the protectors after the step of removing the second dielectric layer in the second region.

14. The method of claim 11, further comprising:
    forming spacers adjoining each sidewalls of the first gate stack, the second gate stack, and the third gate stack.

15. The method of claim 11, the first region is an input/output (I/O) circuit region, the second region is a core device region for forming a standard device, and the third region is a core device region for forming a low power device.

16. The method of claim 11, wherein the first dielectric layer, the second dielectric layer, and the third dielectric layer comprise a same material.

17. The method of claim 11, wherein the first dielectric layer, the second dielectric layer, and the third dielectric layer are silicon oxide.

18. The method of claim 11, wherein the first thickness, the second thickness, and the third thickness are different.

19. The method of claim 11, wherein the second thickness ranges between the first thickness and the third thickness.

20. A method comprising:
    providing a substrate having a device region, a low power device region, and an I/O circuit region;
    forming a first oxide layer over the substrate;
    removing the first oxide layer in the device region and the low power device region;
    forming a second oxide layer in the device region and the low power device region;
    forming a polysilicon layer over the first oxide layer and the second oxide layer;
    patterning the polysilicon layer, the first oxide layer, and the second oxide layer to form a first gate stack in the device region, a second gate stack in the low power device region, and a third gate stack in the I/O circuit region;

forming an ILD layer in between the first gate stack, the second gate stack, and the third gate stack;

removing the patterned polysilicon layer;

forming protectors over the first oxide layer in the I/O circuit region and the second oxide layer in the low power device region;

removing the second oxide layer in the device region;

thereafter removing the protectors;

forming a third oxide layer in the device region;

forming a high-k gate dielectric layer over the first oxide layer, the second oxide layer, and the third oxide layer; and forming a metal gate layer over the high-k gate dielectric layer.

* * * * *